US010161992B2

(12) United States Patent
Kawamura et al.

(10) Patent No.: US 10,161,992 B2
(45) Date of Patent: Dec. 25, 2018

(54) POWER SUPPLY APPARATUS, TRANSPORT DEVICE INCLUDING POWER SUPPLY APPARATUS, DETERMINATION METHOD OF DETERMINING STATE OF SENSOR DETECTING CURRENT VALUE, AND COMPUTER READABLE MEDIUM FOR DETERMINING STATE

(71) Applicant: HONDA MOTOR CO., LTD., Tokyo (JP)

(72) Inventors: Masayuki Kawamura, Saitama (JP); Hajime Fujita, Tokyo (JP); Hirokazu Oguma, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/477,121

(22) Filed: Apr. 3, 2017

(65) Prior Publication Data

US 2017/0292990 A1    Oct. 12, 2017

(30) Foreign Application Priority Data

Apr. 6, 2016   (JP) .................. 2016-076917

(51) Int. Cl.
*G01R 31/40*  (2014.01)
*G01R 31/28*  (2006.01)
*G01R 31/36*  (2006.01)

(52) U.S. Cl.
CPC ..... *G01R 31/2829* (2013.01); *G01R 31/3606* (2013.01); *G01R 31/3658* (2013.01)

(58) Field of Classification Search
CPC ............... G01R 31/36; G01R 31/3658; G01R 31/3606; G01R 31/3624; G01R 31/3679; G01R 31/3693; G01R 31/362; G01R 31/28; G01R 31/2829; G01R 31/2605; G01R 31/405; G01R 31/40; G01R 31/42;
(Continued)

(56) References Cited

U.S. PATENT DOCUMENTS

| | | | |
|---|---|---|---|
| 2007/0222420 A1* | 9/2007 | Nishida ................. | H02J 7/0073 320/162 |
| 2011/0018500 A1* | 1/2011 | Takahashi ............. | H02J 7/0052 320/148 |

(Continued)

FOREIGN PATENT DOCUMENTS

JP    2010-057342 A    3/2010

*Primary Examiner* — Thang Le

(57) ABSTRACT

A power supply includes a first and second electric storage sections, a first sensor detecting a first current of charge/discharge of the first storage section, a second sensor detecting a second current of the charge/discharge of the second storage section, and a circuit module having a control section to determine a state of the first sensor, the second sensor, and/or a third sensor detecting a third current of a driving section by comparing a first current with a third current in a charge/discharge between the first storage section and the driving section, and/or a second current with the third current in a charge/discharge between the second storage section and the driving section, and by comparing the first current with the second current and the first current with the third current in the discharge of the first storage section to the second storage section and the driving section.

20 Claims, 10 Drawing Sheets

(58) Field of Classification Search
CPC .... G01R 31/08; G01R 31/024; G01R 31/025;
G01R 31/31721; G01R 19/155; G01R
19/16538; G01R 19/165; Y02E 10/50;
Y02E 10/58; Y02E 10/566
USPC ..... 324/761.01, 522, 512, 746.01, 555, 606;
320/120, 122, 134, 138, 164, 116
See application file for complete search history.

(56) References Cited

U.S. PATENT DOCUMENTS

2015/0236530 A1* 8/2015 Kato .................. H02J 7/007
320/107
2017/0352926 A1* 12/2017 Kanomata ............ H01M 10/42

* cited by examiner

| COMPARISON DETERMINATION | FIRST CURRENT SENSOR MALFUNCTIONED | SECOND CURRENT SENSOR MALFUNCTIONED | PDU SIDE CURRENT SENSOR MALFUNCTIONED |
|---|---|---|---|
| FIRST BATT–SECOND BATT (PATTERN 1) | MALFUNCTIONED | MALFUNCTIONED | – |
| FIRST BATT–PDU (PATTERN 2) | MALFUNCTIONED | – | MALFUNCTIONED |
| SECOND BATT–PDU (PATTERN 3) | – | MALFUNCTIONED | MALFUNCTIONED |

POWER SUPPLY APPARATUS, TRANSPORT DEVICE INCLUDING POWER SUPPLY APPARATUS, DETERMINATION METHOD OF DETERMINING STATE OF SENSOR DETECTING CURRENT VALUE, AND COMPUTER READABLE MEDIUM FOR DETERMINING STATE

The contents of the following Japanese patent application(s) are incorporated herein by reference:
NO. 2016-076917 filed on Apr. 6, 2016.

BACKGROUND

1. Technical Field

The present invention relates to a power supply apparatus, a transport device including the power supply apparatus, a determination method of determining a state of a sensor which detects a current value, and a computer readable medium for determining the state.

2. Related Art

A technique has been known for determining a malfunction of a battery-side current sensor, if an assumptive malfunction of the battery-side current sensor is detected, by controlling a converter to output a constant power and comparing the battery-side current sensor at that time with a reactor-side current sensor.

PRIOR ART DOCUMENT

Patent Document

[Patent Document 1] Japanese Patent Application Publication No. 2010-057342

SUMMARY

There has been a problem that states of respective current sensors of a plurality of electric storage sections and a driving-section-side current sensor cannot be determined efficiently.

BRIEF DESCRIPTION OF THE DRAWINGS

FIG. 7 shows a drawing for indicating a table to show a relation of determination result between states of respective current sensors and current values of the respective current sensors.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
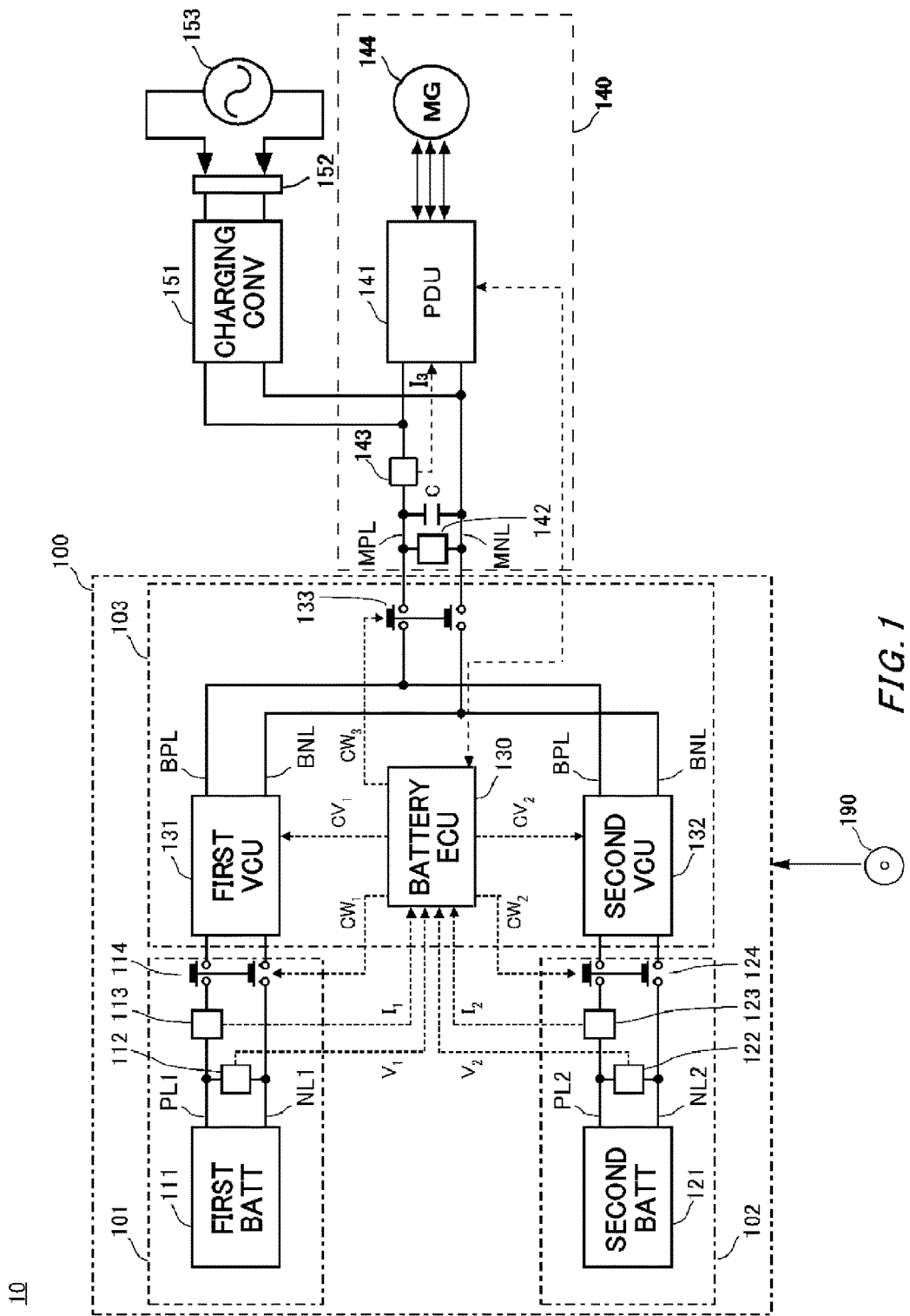
FIG. 1 shows a block diagram of a transport device according to the present embodiment.

FIG. 1 is a block diagram of the transport device 10 according to the present embodiment. The transport device according to the present embodiment is an electric vehicle, for example. In the followings, a power storage device 100 according to the present embodiment will be described assuming a case of being utilized mounted on an electric vehicle. The power storage device 100 is one example of the power supply apparatus.

A PDU 141, which is a power drive unit included in a driving module 140, receives a driving power supplied from the mounted power storage device 100, and the PDU 141 rotationally drives a motor generator (MG 144), such that the transport device 10 runs.

The PDU 141 is connected to the power storage device 100 and a main positive busbar MPL and a main negative busbar MNL. A smoothing condenser C is connected between the main positive busbar MPL and the main negative busbar MNL, reducing a high frequency component of a conducting power. A third voltage sensor 142 included in the driving module 140 detects a voltage Vh between the main positive busbar MPL and the main negative busbar MNL, and the detected voltage Vh is utilized for a control of the PDU 141. A PDU side current sensor 143 included in the driving module 140 detects a current $I_3$ input/output to/from the PDU 141 and outputs the detected value to the PDU 141. In this way, the PDU side current sensor 143 detects a third current value which is a value of charge/discharge current of the MG 144. The detected current value by the PDU side current sensor 143 is utilized for the control of the PDU 141.

The PDU 141 converts a driving power (DC power) supplied from the main positive busbar MPL and the main negative busbar MNL into AC power and outputs the same to the MG 144. The MG 144 includes a three-phase AC rotary electric machine, for example. The MG 144 rotates wheels via a motive power transmission mechanism and a drive shaft. Also, when the wheels are decelerated, the PDU 141 converts AC power generated by the MG 144 into DC power and outputs the same to the main positive busbar MPL and the main negative busbar MNL as a regeneration power.

The first storage battery 111 and the second storage battery 121 included by the power storage device 100 are charged by the regeneration power generated by the MG 144 and an external power from an external power supply 153. Also, the power of at least one of the first storage battery 111 and the second storage battery 121 is supplied to the PDU 141 as the driving power to drive the MG 144.

A charging converter 151 is provided between the main positive busbar MPL and the main negative busbar MNL and the power reception section 152. Further, the charging converter 151 converts the AC power supplied from the external power supply 153 (for example, a household AC power supply) via a power reception section 152 into the DC power to output to the main positive busbar MPL and the main negative busbar MNL. The power reception section 152 is an input terminal for receiving an input of the AC power supplied from the external power supply 153. It should be noted that in lieu of or otherwise in addition to the main positive busbar MPL and the main negative busbar MNL, the charging converter 151 may be connected to a positive electrode line PL1 and a negative electrode line NL1, or may be connected to a positive electrode line PL2 and a negative electrode line NL 2.

The power storage device 100 includes a first electric storage module 101, a second electric storage module 102, and a charge/discharge circuit module 103. The first electric storage module 101 includes a first storage battery 111, a first voltage sensor 112, a first current sensor 113, and a first switch 114. The second electric storage module 102 has a similar configuration to the first electric storage module 101, and has a second storage battery 121, a second voltage sensor 122, a second current sensor 123, and a second switch 124. The charge/discharge circuit module 103 performs charge/discharge between the first storage battery 111 and the second storage battery 121. The charge/discharge circuit module 103 has a battery ECU 130 as a control section and a first VCU 131, a second VCU 132, and a third switch 133, which may function as charge/discharge circuits.

In the present embodiment, the first storage battery 111 functioning as a first electric storage section and the second storage battery 121 functioning as a second electric storage section are DC power supplies capable of charging/discharging, and include a secondary battery such as a lithium-ion battery or a nickel-hydrogen battery, a sodium-ion battery, a lithium-sulfur battery and the like. Other than these, an element capable of charge/discharge, such as a condenser, a capacitor, and the like, may also be included. However, the first storage battery 111 and the second storage battery 121 are the batteries having characteristics different from each other. Specifically, the first storage battery 111 is a so-called high-capacity type battery having a higher mass energy density, which is a storage power per unit mass, than the second storage battery 121. On the other hand, the second storage battery 121 is a so-called high-output type battery having a higher mass output density, which is an output power per unit mass, than the first storage battery 111. The second storage battery 121 may have a higher volume output density, which is an output power per unit volume, than the first storage battery 111, and the first storage battery 111 may have a higher volume energy density, which is a storage power per unit volume, than the second storage battery 121. In this way, the power which can be retrieved from the second storage battery 121 per unit mass or unit volume is larger than the power which can be retrieved by the first storage battery 111 per unit mass or unit volume. On the other hand, the power which can be stored by the first storage battery 111 per unit mass or unit volume is larger than the power which can be stored by the second storage battery 121 per unit mass or unit volume. In this way, the second storage battery 121 has a poor energy density and an excellent output density, compared with the first storage battery 111. Also, the first storage battery 111 has a larger battery capacity compared with the second storage battery 121.

The first storage battery 111 is connected to the first VCU 131 via the positive electrode line PL1 and the negative electrode line NL1. The first voltage sensor 112 detects the voltage between the positive electrode line PL1 and the negative electrode line NL1, i.e. a voltage $V_1$ of the first storage battery 111, and outputs the detected value to the battery ECU 130. The first current sensor 113 detects a current $I_1$ input/output to/from the first storage battery 111 and outputs the detected value to the battery ECU 130. In this way, the first current sensor 113 detects a first current value which is a value of charge/discharge current of the first storage battery 111.

The first switch 114 is a switch for opening/closing electric circuits of the positive electrode line PL1 and the negative electrode line NL1, and receives an opening/closing instruction signal $CW_1$ from the battery ECU 130 and switches the open state/closed state.

The second storage battery 121 is connected to the second VCU 132 via the positive electrode line PL2 and the negative electrode line NL2. The second voltage sensor 122 detects the voltage between the positive electrode line PL2 and the negative electrode line NL2, i.e. a voltage $V_2$ of the second storage battery 121, and outputs the detected value to the battery ECU 130. The second current sensor 123 detects a current $I_2$ input/output to/from the second storage battery 121 and outputs the detected value to the battery ECU 130. In this way, the second current sensor 123 detects a second current value which is a value of charge/discharge current of the second storage battery 121.

The second switch 124 is a switch for opening/closing electric circuits of the positive electrode line PL2 and the negative electrode line NL2, and receives an opening/closing instruction signal $CW_2$ from the battery ECU 130 and switches the open state/closed state.

It should be noted that the first current sensor 113 and the second current sensor 123 detect output currents (discharge currents) from the respectively corresponding storage batteries as positive values and detect input currents (charge currents and regeneration currents) as negative values. In FIG. 1, although a configuration for detecting the currents of the respective positive electrode lines is shown, the configuration may be one for detecting the currents of the negative electrode lines.

The first VCU 131 is provided between the positive electrode line PL1 and the connection positive electrode line BPL, and the negative electrode line NL1 and between the connection negative electrode line BNL, receives the control signal $CV_1$ from the battery ECU 130, and performs a voltage conversion between the positive electrode line PL1 and the connection positive electrode line BPL, and between the negative electrode line NL1 and the connection negative electrode line BNL. The second VCU 132 is provided between the positive electrode line PL2 and the connection positive electrode line BPL, between and the negative electrode line NL2 and the connection negative electrode line BNL, receives the control signal $CV_2$ from the battery ECU 130, and performs a voltage conversion between the positive electrode line PL2 and the connection positive electrode line BPL, and between the negative electrode line NL2 and the connection negative electrode line BNL.

The connection positive electrode line BPL is connected to the main positive busbar MPL, and the connection negative electrode line BNL is connected to the main negative busbar MNL. In the connection section, a third switch 133 is provided. The third switch 133 is a switch for opening/closing electric circuits between the connection positive electrode line BPL and the main positive busbar MPL, and between the connection negative electrode line BNL and the main negative busbar MNL, receives an opening/closing instruction signal $CW_3$ from the battery ECU 130, and switches the open state/closed state.

In the above configurations, in a case where the first switch 114 and the third switch 133 are in the closed state and the second switch 124 is in the open state, the power in the first storage battery 111 is supplied to the PDU 141. Also, in a case where the second switch 124 and the third switch 133 are in the closed state and the first switch 114 is in the open state, the power in the second storage battery 121 is supplied to the PDU 141. Further, in a case where the first switch 114, the second switch 124, and the third switch 133 are in the closed state, the power in the first storage battery 111 and the power in the second storage battery 121 are supplied together to the PDU 141. However, when the power in the first storage battery 111 and the power in the second storage battery 121 are supplied together to the PDU 141, a voltage conversion is performed by the first VCU 131 and the second VCU 132, such that the supplied voltages are the same. It should be noted that when the regeneration power is supplied from the PDU 141, or when an external power from the external power supply 153 is supplied, the power flow is in a reverse direction to the direction in each case described above.

Also, in the present embodiment, a so-called 2 VCU type is adopted, in which a VCU being a voltage conversion unit is provided in each storage battery; however, from the perspective of adjustment of the output voltage of one storage battery with respect to the output voltage of the other storage battery, a so-called 1 VCU type may be adopted, in which one VCU is provided in either of the storage batteries. The 1 VCU type contributes to a reduction of space for arranging the VCU. Also, it contributes to cost reduction and weight reduction as well. In this case, the voltage supplied to the PDU 141 is the output voltage of the storage battery in which the VCU is not provided, so if this restriction is disadvantageous, the 2 VCU type may be adopted.

It should be noted that converters are roughly categorized into a step-up type, a step-down type, and a step-up/down type, and any type of the converters may be adopted for the first VCU 131 and the second VCU 132. Also, the types of the converters adopted for the first VCU 131 and the second VCU 132 may be different from each other. By appropriately combining the converter types of the first storage battery 111 and the second storage battery 121, they can be utilized as a whole that satisfies a required specification, just like one battery.

In a case where the first switch 114 and the second switch 124 are in the closed state and the third switch 133 is in the open state, the charge/discharge is performed between the first storage battery 111 and the second storage battery 121. For this charge/discharge between the storage battery sections, the power flow is determined in accordance with a difference between a conversion voltage value of the first VCU 131 determined by the control signal $CV_1$ from the battery ECU 130 and a conversion voltage value of the second VCU 132 determined by the control signal $CV_2$. Therefore, the battery ECU 130 can control which storage battery is on the power supplying side and which storage battery is on the power receiving side by sending the control signals $CV_1$ and $CV_2$ which instruct the conversion voltage values to the respective VCUs. It should be noted that the control may be performed so as to stop the voltage conversion, control in a so-called direct coupling mode for outputting the output voltage of the storage battery as it is, and to change the other conversion voltage value by fixing a high-side switch of one of the first VCU 131 and the second VCU 132 to the "closed" state as well as a low-side switch of the other to the "open" state. At this time, the battery ECU 130 can grasp a charge/discharge amount in the first storage battery 111 by monitoring the $V_1$ and the $I_1$, and can grasp a charge/discharge amount in the second storage battery 121 by monitoring the $V_2$ and the $I_2$.

Operations of the battery ECU 130 will be further described. The battery ECU 130 controls each section of the charge/discharge circuit module 103, the first electric storage module 101, and the second electric storage module 102. Also, the battery ECU 130 sends the opening/closing instruction signals $CW_1$, $CW_2$, $CW_3$ toward a first switch 114, a second switch 124, and a third switch 133 so as to open/close the respective switches in accordance with situations. Also, the battery ECU 130 sends the control signals $CV_1$, $CV_2$ toward the first VCU 131 and the second VCU 132 so as to adjust the conversion voltages of the respective VCUs.

The battery ECU 130 acquires $I_1$ from the first current sensor 113. Also, the battery ECU 130 acquires $I_2$ from the second current sensor 123. Also, the battery ECU 130 communicates with the PDU 141 via CAN. The battery ECU 130 acquires, from the PDU 141 via CAN, $I_3$ detected by the PDU side current sensor 143. Also, the battery ECU 130 controls the first VCU 131 and the second VCU 132 based on the acquired $I_1$, $I_2$, and $I_3$. Also, the battery ECU 130 calculates the SOC of the first storage battery 111 and the SOC of the second storage battery 121 based on the acquired $I_1$ and $I_2$. Also, the battery ECU 130 determines a state of at least one of the first current sensor 113, the second current sensor 123, and the PDU side current sensor 143 based on the acquired $I_1$, $I_2$, and $I_3$.

Specifically, the battery ECU 130 can perform at least one of a first operation of comparing $I_1$ with $I_3$ in the charge/discharge between the first storage battery 111 and the MG 144, and a second operation of comparing $I_2$ with $I_3$ in the charge/discharge between the second storage battery 121 and the MG 144. Also, the battery ECU 130 can perform a third operation of respectively comparing $I_1$ with $I_2$ and $I_1$ with $I_3$ in a simultaneous discharge of the first storage battery 111 to the second storage battery 121 and the MG 144. Then, the battery ECU 130 determines a state of at least one of the first current sensor 113, the second current sensor 123, and the PDU side current sensor 143 by at least one of the first operation and the second operation and by the third operation. According to the battery ECU 130, since the comparison is made using the current value when the first storage battery 111 performs the simultaneous discharge to the second storage battery 121 and the MG 144, the states of the current sensors can be detected efficiently. Further, since any of the first to third operations includes the charge/discharge to the MG 144, the state of the current sensor driven by the driving module 140 can be detected even if, for example, during the vehicle running.

It should be noted that the driving module 140 outputs a required power, the power required to the MG 144. In the third operation, the battery ECU 130 controls at least one of the first VCU 131 and the second VCU 132 such that the first storage battery 111 outputs a constant power without depending on the required power and the second storage battery 121 is charged by a difference between the constant power and the required power. Accordingly, if the required power is smaller than the constant power, the simultaneous discharge of the first storage battery 111 to the second storage battery 121 and the MG 144 occurs.

In the third operation, the first current sensor 113 detects the constant power output by the first storage battery 111. Also, in the third operation, the battery ECU 130 respectively compares a value corresponding to the required power in $I_1$ with $I_3$, and a value corresponding to a difference between the constant power and the required power in $I_1$ with $I_2$.

The battery ECU 130 acquires the SOC of the second storage battery 121. The battery ECU 130 may set the constant power based on the SOC of the second storage battery 121. The battery ECU 130 may set the constant power to become larger as the SOC of the second storage battery 121 is smaller.

It should be noted that the battery ECU 130 determines whether or not the current values, which are compared in at least one of the first operation and the second operation and in the third operation, are equivalent or have a correlation. Here, the correlation may be based on step-up/down rates of the first VCU 131 and the second VCU 132 between the current sensors detecting the current values to be compared. Accordingly, even if a voltage conversion circuit exists in the charge/discharge path, the battery ECU 130 can appropriately determine whether or not there is a correlation between the current values of the respective current sensors by taking a step-up/down rate according to the voltage conversion circuit into account.

The battery ECU 130 is one type of computer. The battery ECU 130 is configured with a MPU, for example, and executes a program stored in an internal storage section of the MPU, for example, and controls the entire power storage device 100 in accordance with the program. The program executed by the battery ECU 130 is supplied from a recording medium 190 to the battery ECU 130 within the power storage device 100. The recording medium 190 is one example of a medium readable by a computer. Any medium in which a program or a computer instruction is stored within the battery ECU 130 can be considered as a medium to store a program used for the battery ECU 130.

As described above, the power storage device 100 in the present embodiment includes two storage batteries having characteristics different from each other. A system using a plurality of the storage batteries having characteristics different from each other needs to finely control how to respond a requested power supply in accordance with the characteristics or states of the respective storage batteries. Here, at first, a difference in power outputs between a case of using a single storage battery and a case of using a plurality of storage batteries having different characteristics will be described.

Figure 2:
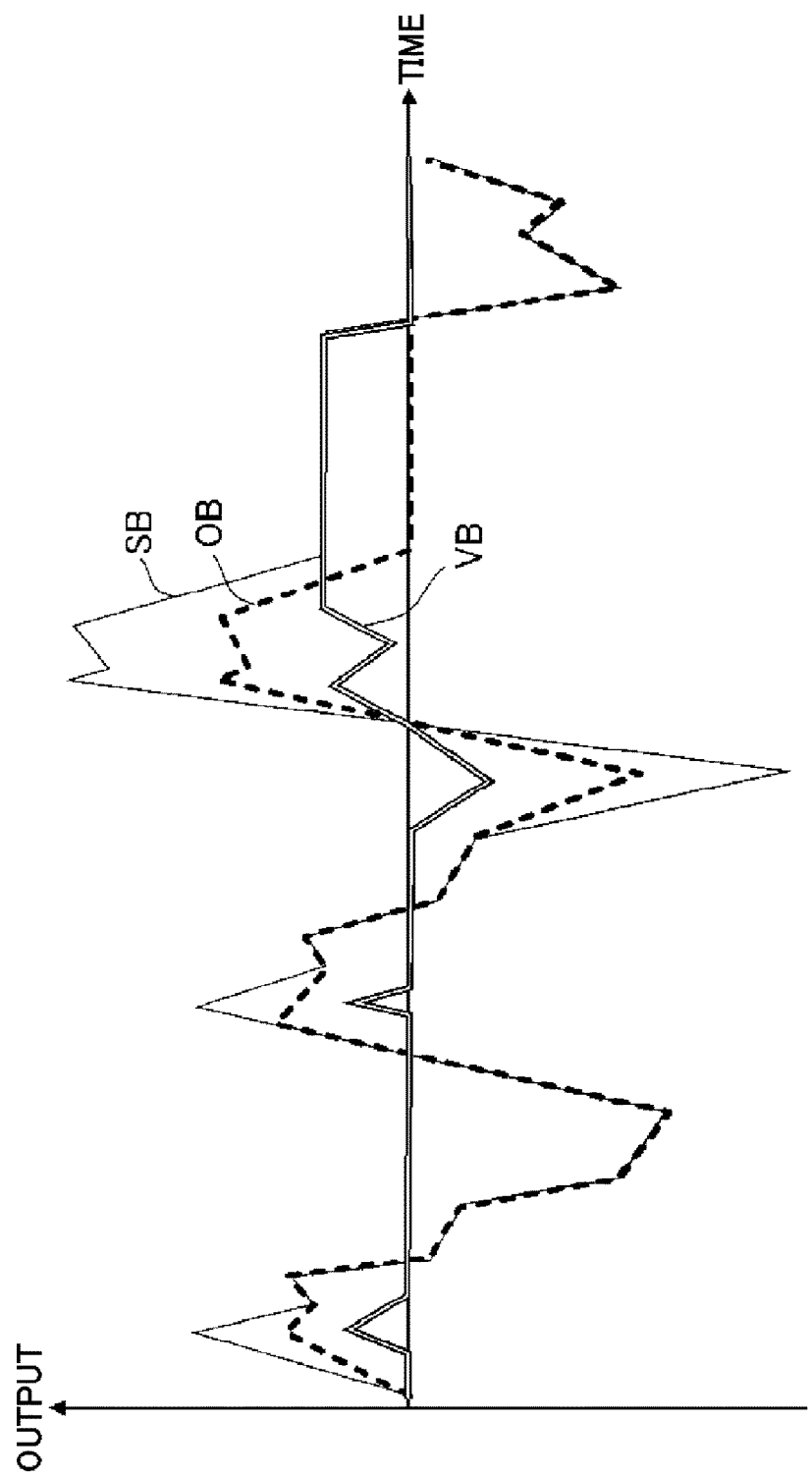
FIG. 2 shows a drawing for a comparison of power outputs between a case where a single storage battery is used and a case where two storage batteries are used.

FIG. 2 is a drawing for a comparison of power outputs between a case of using a single storage battery and a case of using two storage batteries having different characteristics. The horizontal axis indicates the lapse of time, and the vertical axis indicates the power output. An area in which the power output is negative indicates that the regeneration power is input, for example.

SB shown by the solid line indicates an output power change in a case where the power storage device is configured with one storage battery. In a case where the power storage device includes only one storage battery, power requested by the load side is output as requested in the capability range and input power is accepted as it is. Therefore, there may also be a case where a large output/input is performed within a short period of time, and there is a problem that the storage battery is rapidly degraded and the like as well.

In a case where a power storage device is configured with two storage batteries having different characteristics, the output/input can be shared in accordance with the respective characteristics. OB shown by the dotted line indicates an output power change of a high-output type battery, and VB shown by double lines indicates an output power change of a high-capacity type battery. At each time, an SB value is obtained by adding an OB value to a VB value. That is, a situation is shown, where the power requested by the load side is shared by the high-capacity type battery and the high-capacity type battery.

In the high-capacity type battery, generally, since the degradation progresses due to high output/input and an immediate change of the output/input, it is preferable to control the output/input to be performed in a range in which the degradation progress is suppressed. Therefore, as it can be seen from the change in the OB and the VB, if a large output/input is requested by the load side, the high-output type battery (OB) performs the control basically, and if the high-output type battery is not able to support, the high-capacity type battery (VB) assists the output/input. Also, the high-capacity type battery is adapted in a case where the output is continued with a value which is not very high, and in this case, the output of the high-output type battery can be suppressed. Also, since the high-capacity type battery has a characteristic that it degrades easily if accepting a regeneration power corresponding to a high-rate charge, a control is performed in which the regeneration power is accepted by the high-output type battery as much as possible. It should be noted that if the regeneration power is greater than the capacity that the high-output type battery can accept, the generation of the regeneration power may be reduced by operating a brake, other than using the high-capacity type battery to accept. In this case, the degradation of the high-capacity type battery can be suppressed.

Also, the high-capacity type battery and the high-output type battery have influences of degradation respectively based on the SOCs, which are also significantly different from each other. For the high-capacity type battery, the influence of degradation does not greatly change even if the SOC changes. In other words, the degradation progress is not greatly influenced by the SOC even if any value. On the other hand, for the high-output type battery, as the SOC changes, the influence of degradation changes greatly in accordance with the value. To describe in more detail, although the influence of degradation of the high-output type battery is small in a central area in which the SOC is 30% to 70%, the influence of degradation becomes larger as it is away from this central area. That is, the degradation progresses more as it is away from the central area. Therefore, it is preferable to adjust the charge/discharge amounts of the high-capacity type battery and the high-output type battery such that the SOC of the high-output type battery is not belonged to a low area of 0% to 30% or a high area of 70% to 100%.

In this way, by utilizing a plurality of storage batteries having different characteristics, various output requests from a load side can be supported while the degradations of the respective storage batteries can be suppressed.

For that purpose, it is necessary to precisely grasp the currents of charge/discharge of the respective storage batteries and the currents flowing between the storage batteries and the driving module. However, if the current sensor malfunctions, there is a risk that the control accuracy declines and the degradation of the storage battery is accelerated. Therefore, it is necessary to precisely detect the state of each current sensor. It should be noted that in the present embodiment, the phrase "malfunction of current sensor" means that functions of the current sensor are not able to work normally. For example, the malfunction of the current sensor is a concept including that, for example, the accuracy of the current sensor declines or an abnormal value is detected or a defective operation in the current sensors occurs, by an upper stuck-at failure, a middle stuck-at failure, or a lower stuck-at failure and the like.

Here, the operations for detecting the states of the first current sensor 113, the second current sensor 123 and the third PDU side current sensor 143 in the transport device 10 will be described for each pattern of transfer of charges among the first storage battery 111, the second storage battery 121, and the PDU 141.

Figure 3:
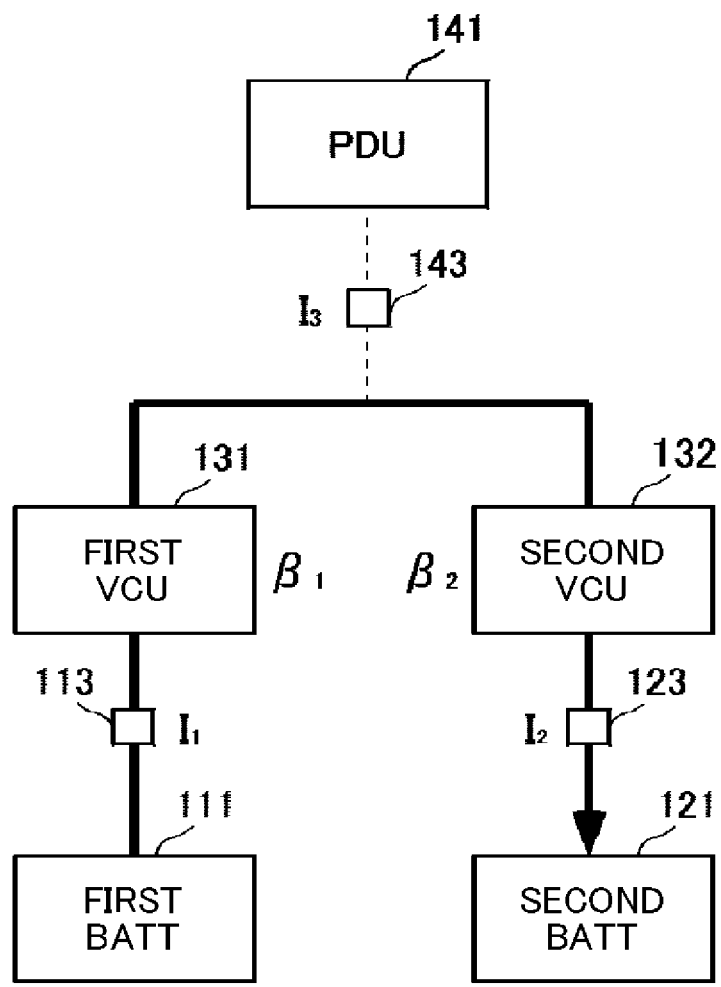
FIG. 3 shows a drawing for indicating a state where a transfer of charges is being performed only between a first storage battery 111 and a second storage battery 121.

FIG. 3 is a drawing indicating a state where a transfer of charges is being performed only between the first storage battery 111 and the second storage battery 121. This pattern of transfer of charges may be called Pattern 1 in some cases. FIG. 3 shows in particular a state where the first storage battery 111 is discharging and the second storage battery 121 is charging.

Here, an inverse of a voltage conversion ratio of the first VCU 131 is set as $\beta_1$, an inverse of a voltage conversion ratio of the second VCU 132 is set as $\beta_2$, a first current value which is a current value detected by the first current sensor 113 is set as $I_1$, and a second current value which is a current value detected by the second current sensor 123 is set as $I_2$. If $I_2=\beta_1 \times \beta_2 \times I_1$, it can be determined that any of the first current sensor 113 and the second current sensor 123 is normal. On the other hand, if $I_2 \neq \beta_1 \times \beta_2 \times I_1$, it can be determined that at least one of the first current sensor 113 and the second current sensor 123 is malfunctioning.

It should be noted that even if the first current sensor 113 and the second current sensor 123 are both normal, there may be a case where $I_2$ is not exactly equal to $\beta_1 \times \beta_2 \times I_1$ actually due to a conduction loss and the like. For that reason, if $I_2$ and $\beta_1 \times \beta_2 \times I_1$ are equivalent or have a correlation with some allowable errors, it is determined that any of the first current sensor 113 and the second current sensor 123 is normal. For example, if a difference between $I_2$ and $\beta_1 \times \beta_2 \times I_1$ is smaller than a predetermined value, it is determined that any of the first current sensor 113 and the second current sensor 123 is normal. In the present embodiment, in a case where two current values are compared by formulas including an equality sign or an inequality sign, the equality sign means that the compared current values are equivalent or have a correlation with some allowable errors, and the inequality sign means that the compared current values are not equivalent or do not have a correlation with some allowable errors.

Figure 4:
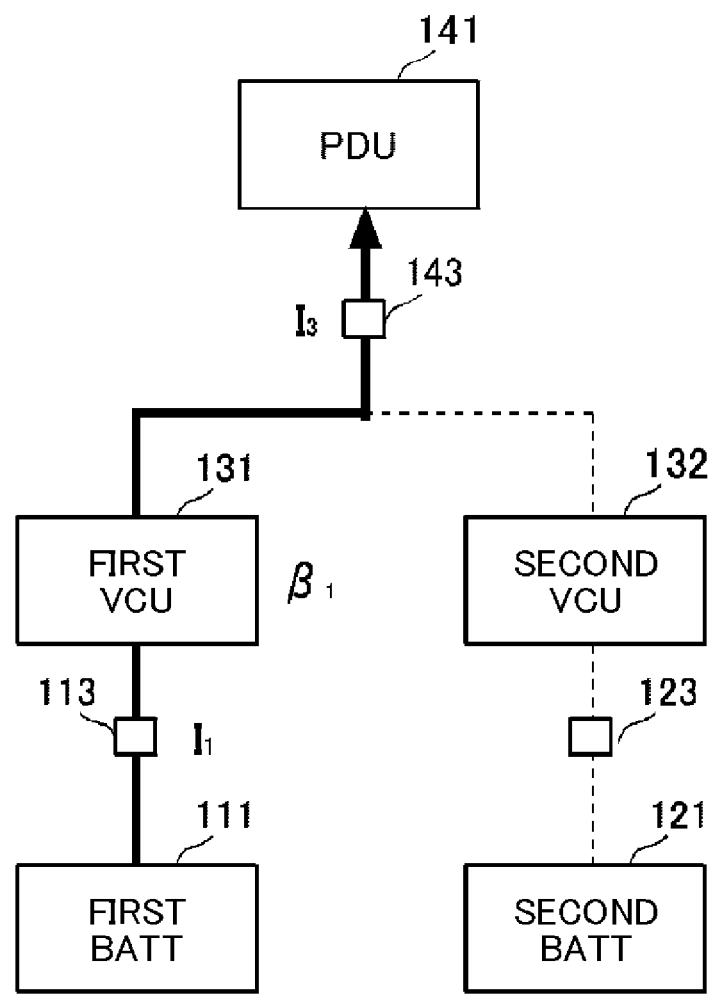
FIG. 4 shows a drawing for indicating a state where the transfer of charges is being performed only between the first storage battery 111 and a PDU 141.

FIG. 4 is a drawing for indicating a state where a transfer of charges is being performed only between the first storage battery 111 and the PDU 141. This pattern of transfer of charges is called a Pattern 2 in some cases. FIG. 4 indicates in particular a state where the first storage battery 111 is discharging and the charges from the first storage battery 111 is flowing to the PDU 141.

Here, a third current value which is a current value detected by the PDU side current sensor 143 is set as $I_3$. If $I_3=\beta_1 \times I_1$ is satisfied, it can be determined that any of the first current sensor 113 and the PDU side current sensor 143 is normal. On the other hand, if $I_3 \neq \beta_1 \times I_1$, it can be determined that at least one of the first current sensor 113 and the PDU side current sensor 143 is malfunctioning.

Figure 5:
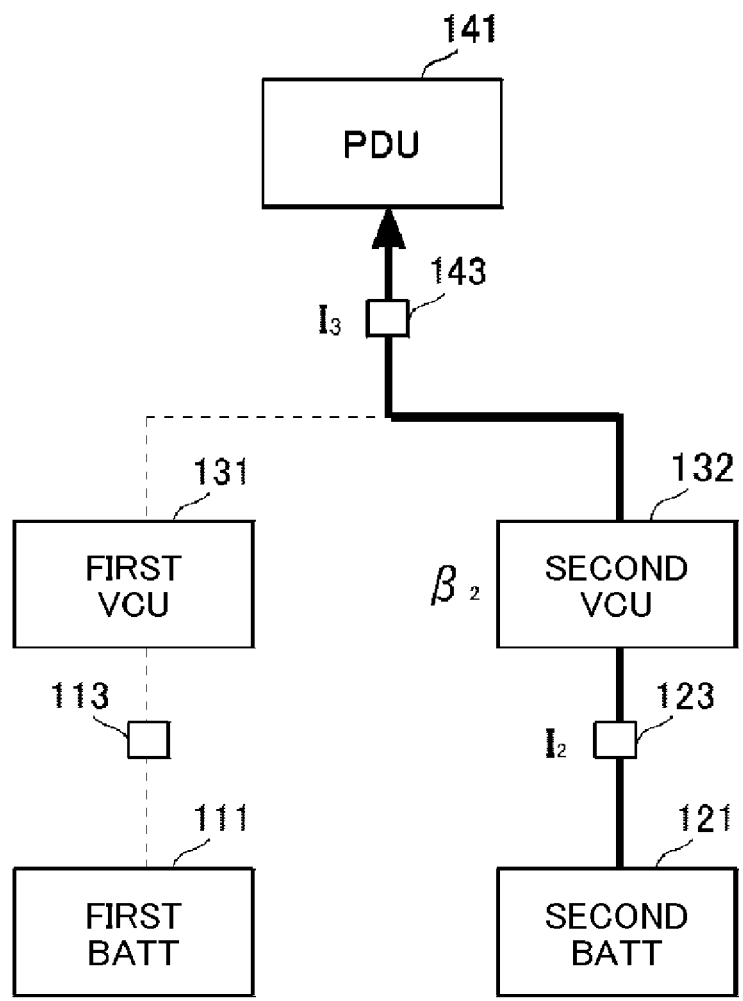
FIG. 5 shows a drawing for indicating a state where the transfer of charges is being performed only between the second storage battery 121 and the PDU 141.

FIG. 5 is a drawing indicating a state where a transfer of charges is being performed only between the second storage battery 121 and the PDU 141. This pattern of transfer of charges is called a Pattern 3 in some cases. FIG. 5 indicates in particular a state where the second storage battery 121 is discharging and the charges from the second storage battery 121 is flowing to the PDU 141.

If $I_3=\beta_2 \times I_2$ is satisfied, it can be determined that any of the second current sensor 123 and the PDU side current sensor 143 is normal. On the other hand, if $I_3 \neq \beta_2 \times I_2$, it can be determined that at least one of the second current sensor 123 and the PDU side current sensor 143 is malfunctioning.

Figure 6:
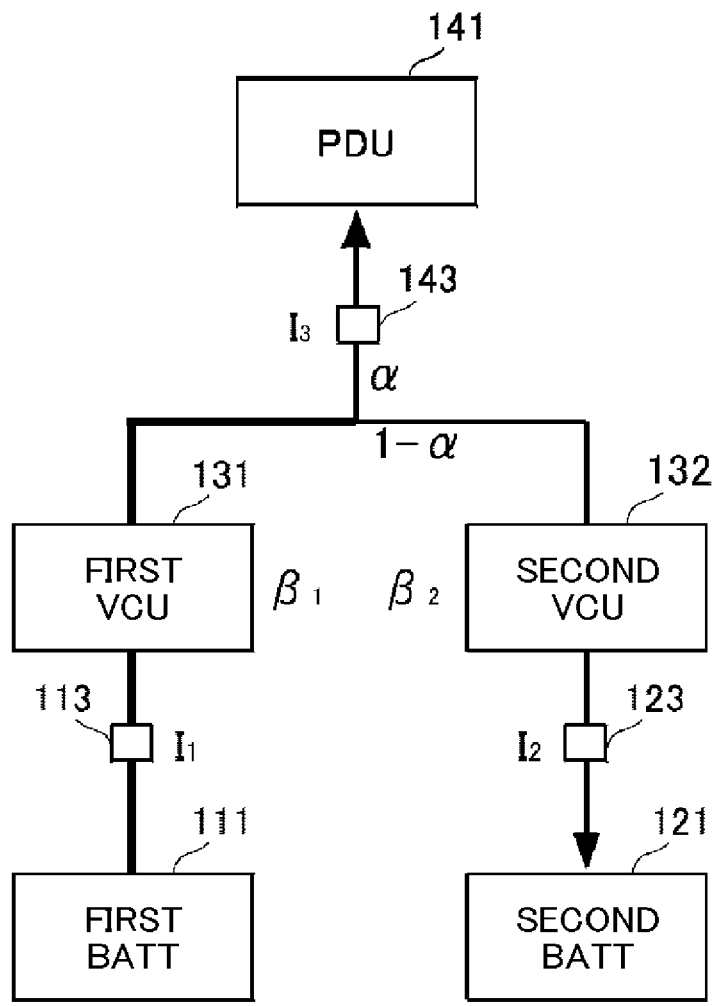
FIG. 6 shows a drawing for indicating a state where the transfer of charges is being performed among the first storage battery 111, the second storage battery 121, and the PDU 141.

FIG. 6 is a drawing indicating a state where the transfer of charges is being performed among the first storage battery 111, the second storage battery 121, and the PDU 141. FIG. 6 indicates in particular a state where the first storage battery 111 is discharging and the charges from the first storage battery 111 is flowing to the PDU 141 and the second storage battery 121. In this state, power energy not less than the power energy required by the driving module 140 is retrieved from the first storage battery 111 and some of the power energy is supplied to the second storage battery 121. For that reason, this pattern of transfer of charges is called a forced discharge pattern of the first storage battery 111 in some cases. In the forced discharge pattern, both patterns of the above-described Pattern 1 and Pattern 2 of transfer of charges occur.

Here, a proportion of the currents distributed from the first storage battery 111 to the PDU 141 is set as $\alpha$. In this case, if $I_3=\alpha \times \beta_1 \times I_1$ is satisfied, it can be determined that any of the first current sensor 113 and the PDU side current sensor 143 is normal. On the other hand, if $I_3 \neq \alpha \times \beta_1 \times I_1$, it can be determined that at least one of the first current sensor 113 and the PDU side current sensor 143 is malfunctioning. Also, if $I_2=(1-\alpha) \times \beta_1 \times \beta_2 \times I_1$ is satisfied, it can be determined that any of the first current sensor 113 and the second current sensor 123 is normal. On the other hand, if $I_2 \neq (1-\alpha) \times \beta_1 \times \beta_2 \times I_1$, it can be determined that at least one of the first current sensor 113 and the second current sensor 123 is malfunctioning.

FIG. 7 is a drawing indicating a table to show a relation of determination result between states of the respective current sensors and current values of the respective current sensors. For example, as shown in FIG. 7, the malfunction of the first current sensor 113 can be detected according to a comparison result between $I_1$ of the first storage battery 111 and $I_2$ of the second storage battery 121 by Pattern 1 or a comparison result between $I_1$ and $I_3$ of the PDU 141. Also, the malfunction of the second current sensor 123 can be detected according to a comparison result between $I_1$ and $I_2$ or a comparison result between $I_2$ and $I_3$. Also, the malfunction of the PDU side current sensor 143 can be detected according to a comparison result between $I_1$ and $I_3$ or a comparison result between $I_2$ and $I_3$.

For example, a case where $I_2 \neq \beta_1 \times \beta_2 \times I_1$ in the comparison by Pattern 1 will be described specifically. In this case, although it can be determined that at least one of the first current sensor 113 and the second current sensor 123 is malfunctioning, it cannot be determined whether either of the first current sensor 113 and the second current sensor 123 is malfunctioning or both are malfunctioning. However, according to Pattern 3 it can also be determined whether or not the second current sensor 123 is malfunctioning. For example, if $I_3=\beta_2 \times I_2$ in the comparison by Pattern 3, since it can be determined that the second current sensor 123 and the PDU side current sensor 143 are normal, it can be determined that only the first current sensor 113 is malfunctioning.

On the other hand, if $I_3 \neq \beta_2 \times I_2$ in the comparison by Pattern 3, it still cannot be determined whether either of the first current sensor 113 and the second current sensor 123 is malfunctioning or both are malfunctioning. However, according to Pattern 2, it can also be determined that whether or not the first current sensor 113 is malfunctioning. According to the comparison by Pattern 2, if $I_3 = \beta_1 \times I_1$, since it can be determined that the first current sensor 113 and the PDU side current sensor 143 are normal, it can be determined that only the second current sensor 123 is malfunctioning. In this way, since two patterns which are capable of detecting the malfunction of each current sensor exist, if one current sensor malfunctioned, that current sensor can be specified.

It should be noted that according to the forced discharge pattern described with reference to FIG. 6, the determination by Pattern 1 and the determination by Pattern 2 can be performed. Therefore, by comparing the current values obtained when the forced discharge pattern has occurred, the states of the current sensors can be efficiently determined.

Figure 8:
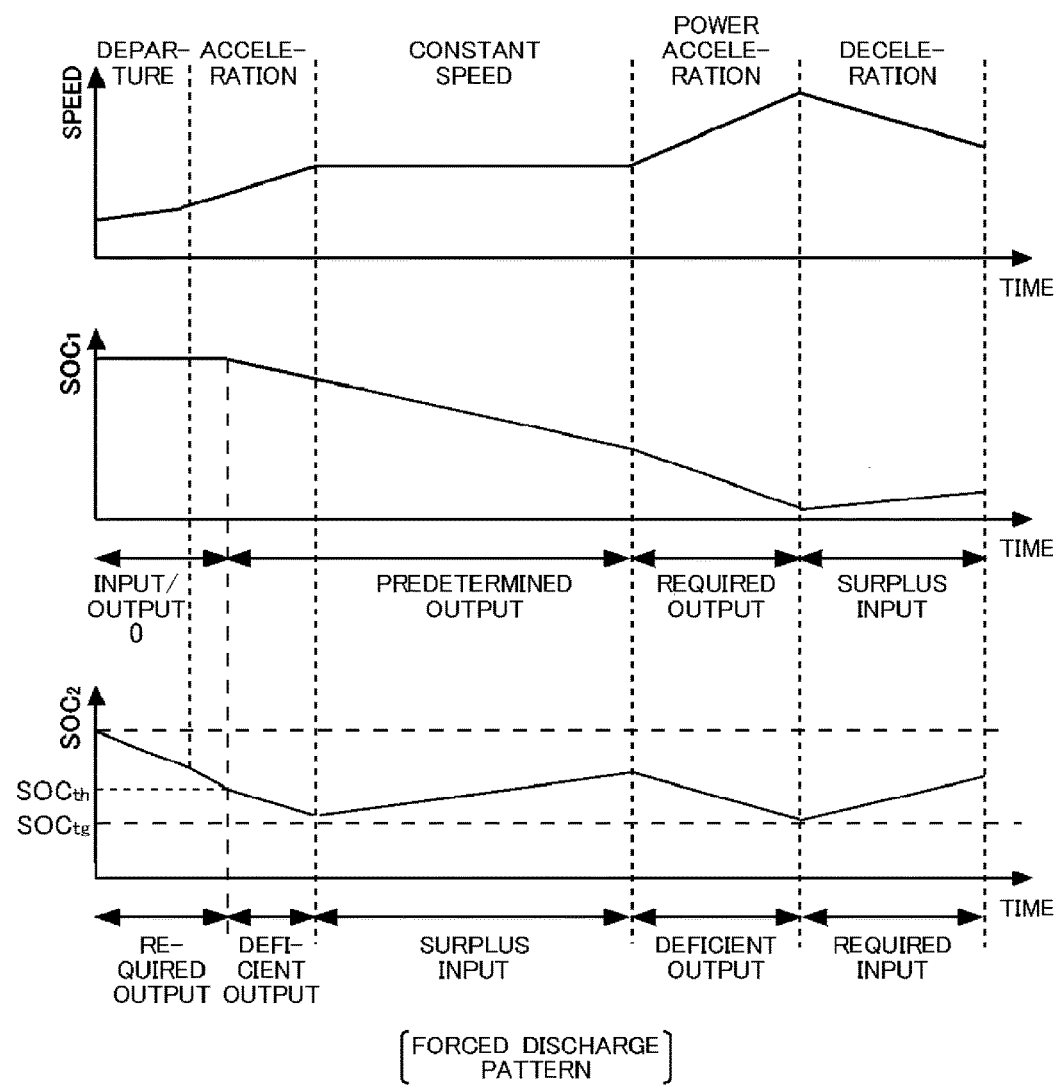
FIG. 8 shows a drawing for indicating one example of a driving operation of a transport device 10 including a forced discharge pattern.

FIG. 8 is a drawing indicating one example of a driving operation of the transport device 10 including the forced discharge pattern. In FIG. 8, the speed of the transport device 10, $SOC_1$ which is the SOC of the first storage battery 111, $SOC_2$ which is the SOC of the second storage battery 121 are shown.

If the SOC of the second storage battery 121 exceeds a predetermined threshold $SOC_{th}$, the battery ECU 130 controls the second VCU 132 such that the driving power to the driving module 140 is supplied from the second storage battery 121. As shown in FIG. 8, when a departure and in the beginning of acceleration running of the transport device 10, the SOC of the second storage battery 121 exceeds the threshold $SOC_{th}$ and the required power is not more than an output allowable power which is allowable to be output from the second storage battery 121. For that reason, the battery ECU 130 controls the second VCU 132 such that all the required power from the driving module 140 is supplied from the second storage battery 121. In this case, the state by the above-described Pattern 3 occurs. The battery ECU 130 acquires the current values respectively from the second current sensor 123 and the PDU side current sensor 143 in this state to use for determining the states of the current sensors.

As the SOC of the second storage battery 121 becomes not more than the threshold $SOC_{th}$, the battery ECU 130 controls the first VCU 131 and causes the first storage battery 111 to start to output the power. In this case, the battery ECU 130 controls the first VCU 131 such that the power with the predetermined value in accordance with the SOC of the second storage battery 121 is supplied from the first storage battery 111. At this time, if the power with the predetermined value from the first storage battery 111 is deficient than the required power from the driving module 140, as shown in FIG. 8, the second VCU 132 is controlled such that the deficient power is output from the second storage battery 121.

As shown in FIG. 8, as the transport device 10 shifts to run at a constant speed and the required power declines, a surplus occurs in the power with the predetermined value from the first storage battery 111. The battery ECU 130 controls the second VCU 132 such that this surplus power is supplied to the second storage battery 121. In this case, the forced discharge pattern of the above-described first storage battery 111 occurs. The battery ECU 130 acquires the current values from the first current sensor 113, the second current sensor 123, and the PDU side current sensor 143 in this state to use for determining the states of the respective current sensor. A specific determination flow will be described later.

As shown in FIG. 8, as the transport device 10 shifts to run by a power acceleration, the required power becomes further larger, and a sum of the power with the predetermined value from the first storage battery 111 and the output allowable power of the second storage battery 121 exceeds the required power, the battery ECU 130 controls the first VCU 131 such that the further deficient power to the required power is supplied from the first storage battery 111 as well as controlling the second VCU 132 such that the output allowable power is supplied from the second storage battery 121.

Also, as shown in FIG. 8, when the transport device 10 is decelerated, a regeneration power which occurred at the MG 144 is output from the driving module 140 to the power storage device 100 side. The battery ECU 130 controls the first VCU 131 such that the regeneration power is supplied to the second storage battery 121. If the regeneration power exceeds an allowable input power which is allowable to be input to the second storage battery 121, the battery ECU 130 controls the first VCU 131 such that the surplus power is supplied to the first storage battery 111.

Figure 9:
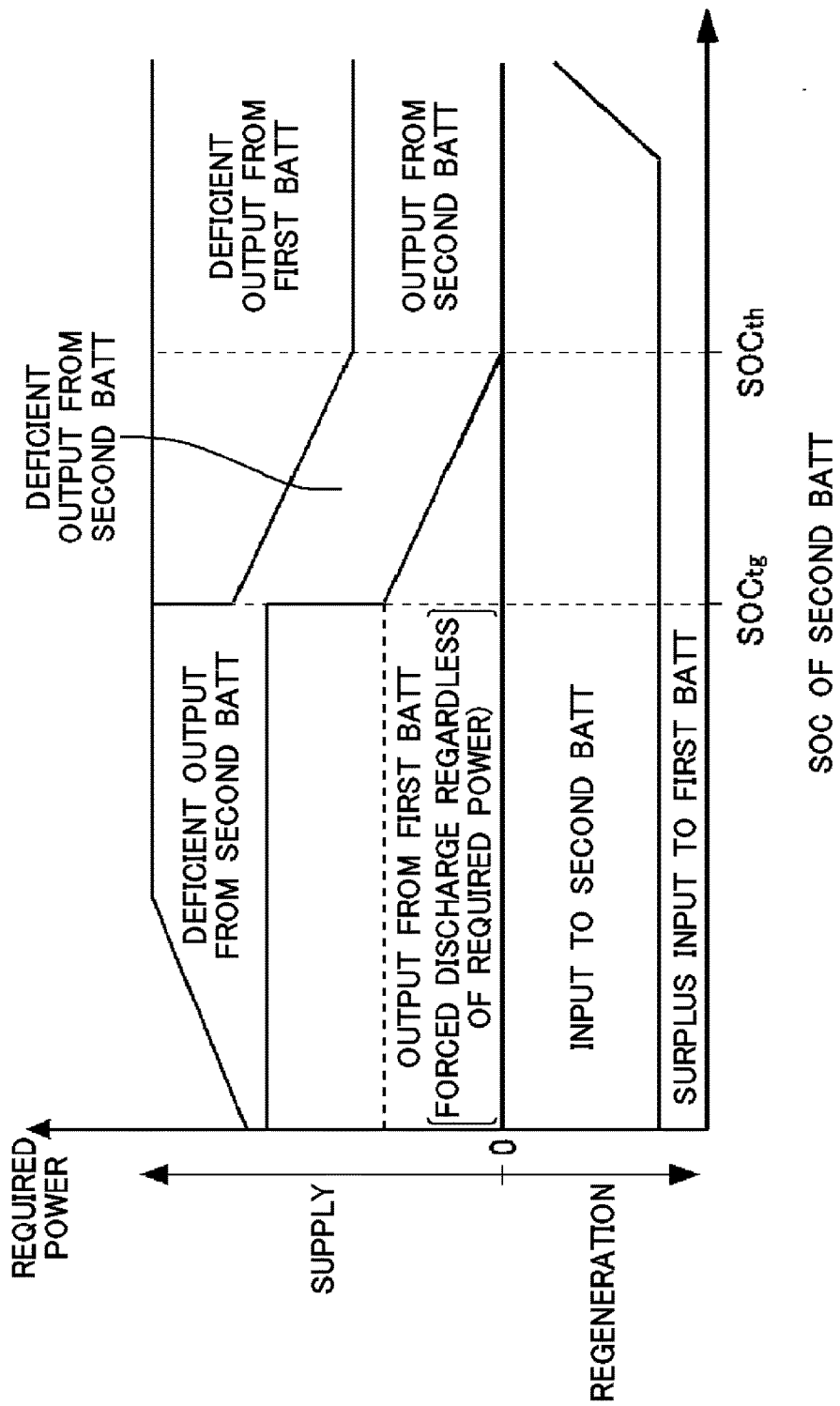
FIG. 9 shows a drawing for indicating, for each SOC of the second storage battery 121, input/output of power in each of the first storage battery 111 and the second storage battery 121 in accordance with a required power.

FIG. 9 is a drawing indicating input/output power in each of the first storage battery 111 and the second storage battery 121 for each SOC of the second storage battery 121. Based on the information indicated in FIG. 9, the battery ECU 130 controls the first VCU 131 and the second VCU 132 such that the input/output power to each of the first storage battery 111 and the second storage battery 121 is determined and the determined input/output power is generated.

First, a case where the regeneration power has occurred will be described. The battery ECU 130 selects the second storage battery 121 as a receiver of the regeneration power regardless of the SOC of the second storage battery 121. The battery ECU 130 controls the second VCU 132 such that the power with an amount in accordance with the regeneration power is input to the second storage battery 121. In a case where the regeneration power is large and the surplus occurs in the regeneration power with respect to the input allowable power of the second storage battery 121, the battery ECU 130 controls the first VCU 131 such that the surplus is input to the first storage battery 111.

Next, a case where the SOC of the second storage battery 121 is not less than the threshold $SOC_{th}$ will be described. As described above, if the required power from the driving module 140 is not more than the output allowable power from the second storage battery 121, the battery ECU 130 controls the second VCU 132 such that all the required power is output from the second storage battery 121. If the required power exceeds the output allowable power, the first VCU 131 is controlled such that the deficient power with respect to the required power is output from the first storage battery 111.

Next, a case where the SOC of the second storage battery 121 is not less than a target value $SOC_{tg}$ and less than the threshold $SOC_{th}$ will be described. Here, the target value $SOC_{tg}$ is a predetermined value which is smaller than the threshold $SOC_{th}$. In this case, the power is supplied with priority from the first storage battery 111 with respect to the required power. In this case, the battery ECU 130 controls the first VCU 131 such that the output power from the first storage battery 111 becomes the predetermined value in accordance with the SOC of the second storage battery 121. In this case, the power with the predetermined value from the first storage battery 111 may be larger than the required power from the driving module 140 in some cases. At this time, the battery ECU 130 controls the second VCU 132 such that the surplus power is input to the second storage battery 121. In this case, the forced discharge pattern from the first storage battery 111 occurs. Therefore, if the SOC of the second storage battery 121 is not less than the target value $SOC_{tg}$ and less than the threshold $SOC_{th}$, the proportion a of the currents distributed from the first storage battery 111 to the PDU 141 is determined by the SOC of the second storage battery 121 and the required power.

On the other hand, if the required power is larger than the power with the predetermined value from the first storage battery 111, the battery ECU 130 controls the second VCU 132 such that the deficient power is output from the second storage battery 121. Also, as described above, in a case where the required power exceeds a sum of the power with the predetermined value from the first storage battery 111 and the output allowable power of the second storage battery 121, the battery ECU 130 controls the first VCU 131 such that the deficient power is further output from the first storage battery 111.

Next, a case where the SOC is less than the target value $SOC_{tg}$ will be described. In this case, similar to a case where the SOC of the second storage battery 121 is not less than the target value $SOC_{tg}$ and less than the threshold $SOC_{th}$, the power is supplied with priority from the first storage battery 111 with respect to the required power. In this case, the battery ECU 130 controls the first VCU 131 such that the output power from the first storage battery 111 becomes a constant value. In this case, the power with the constant value from the first storage battery 111 may become larger than the required power from the driving module 140 in some cases. At this time, the battery ECU 130 controls the second VCU 132 such that the surplus power is input to the second storage battery 121. The forced discharge pattern from the first storage battery 111 also occurs in this case. Therefore, when the SOC of the second storage battery 121 is less than the target value, a is determined by the output power with the constant value from the first storage battery 111 and the required power.

On the other hand, if the power with the constant value from the first storage battery 111 is larger than the required power, the battery ECU 130 controls the second VCU 132 such that the deficient power is output from the second storage battery 121. Only when the required power exceeds the output allowable power which is allowable to be output from the first storage battery 111, the battery ECU 130 controls the second VCU 132 such that the deficient power is output from the second storage battery 121.

As described above, in a case where the required power from the driving module 140 and the SOC of the second storage battery 121 satisfy the predetermined condition when the transport device 10 is running, the forced discharge pattern of the first storage battery 111 described above occurs. The battery ECU 130 can efficiently determine the current sensor malfunction using the detected current values by the current sensors when the forced discharge pattern has occurred.

Figure 10:
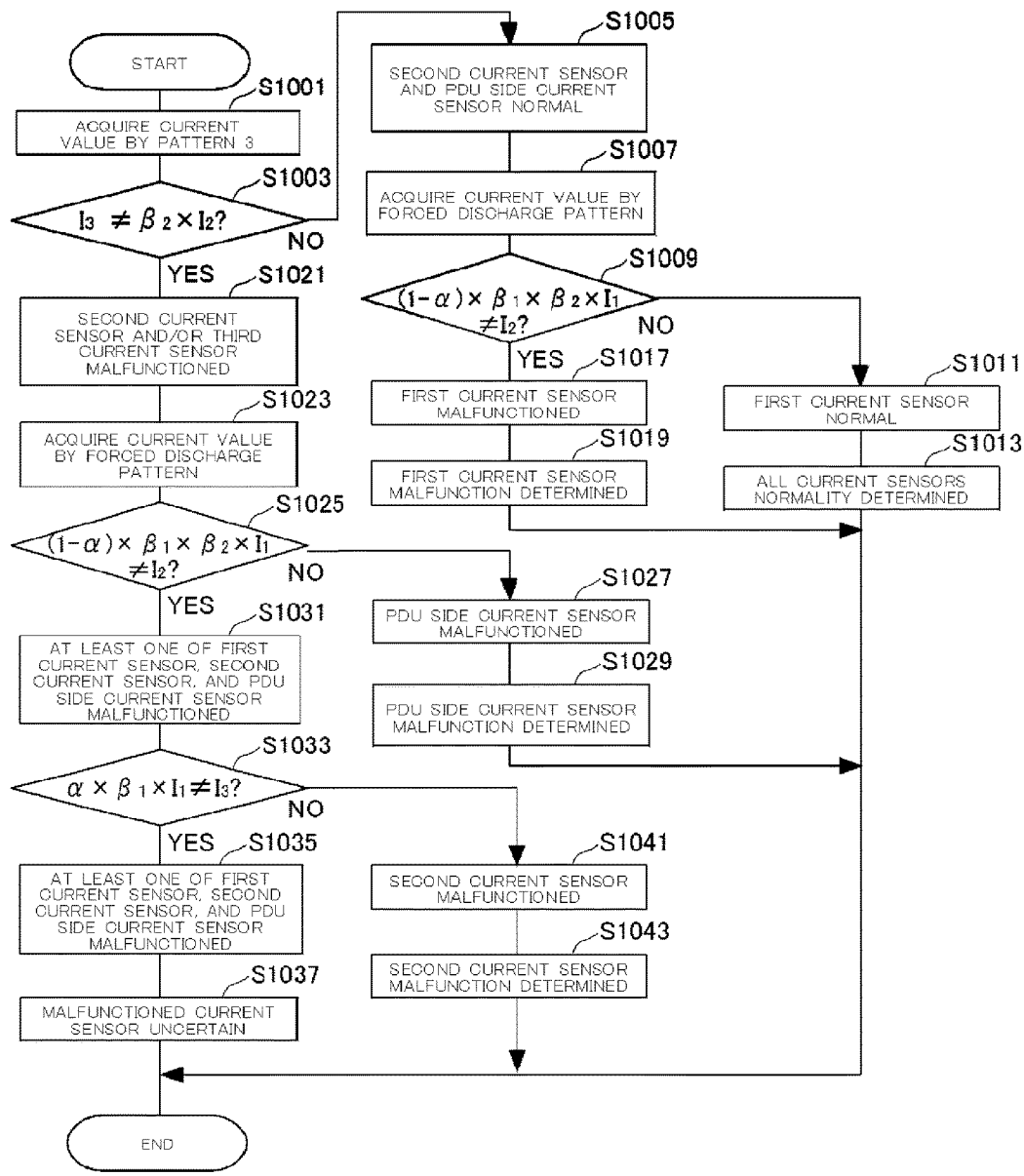
FIG. 10 shows a flow chart for determining states of a first current sensor 113, a second current sensor 123, and a PDU side current sensor 143.

FIG. 10 is a flow chart for determining the states of the first current sensor 113, the second current sensor 123, and the PDU side current sensor 143. The flow may be carried out periodically in the battery ECU 130. Also, the flow may start in the battery ECU 130 based on the instruction from the control section of the transport device 10.

At a step S1001, the battery ECU 130 acquires $I_2$ and $I_3$ in the Pattern 3 state described with reference to FIG. 5 and the like. At a step S1003, the battery ECU 130 determines whether or not $I_3 \neq \beta_2 \times I_2$. If the determination at the step S1003 is false (NO), the battery ECU 130 determines that the second current sensor 123 and the PDU side current sensor 143 are normal (Step S1005).

Subsequently, at a step S1007, the battery ECU 130 acquires $I_1$ and $I_2$ in the forced discharge pattern state described with reference to FIG. 6 an the like. Then, at a step S1009, the battery ECU 130 determines whether or not $(1-\alpha) \times \beta_1 \times \beta_2 \times I_1 \neq I_2$. If the determination at the step S1009 is false, the battery ECU 130 determines that the first current sensor 113 is normal (Step S1011). Then, at the step S1013, it is determined that all of the current sensors of the first current sensor 113, the second current sensor 123, and the PDU side current sensor 143 are normal, and the flow ends.

If the determination at the step S1009 is true (YES), the battery ECU 130 determines that the first current sensor 113 is malfunctioning (Step S1017). Accordingly, at a step S1019, it is determined that only the first current sensor 113 is malfunctioning, and the flow ends.

If the determination at the step S1003 is true, the battery ECU 130 determines that at least one of the second current sensor 123 and the PDU side current sensor 143 is malfunctioning (Step S1021).

Subsequently, at a step S1023, the battery ECU 130 acquires $I_1$ and $I_2$ in the forced discharge pattern state described with reference to FIG. 6 and the like. Then, at a step S1025, the battery ECU 130 determines whether or not $(1-\alpha) \times \beta_1 \times \beta_2 \times I_1 \neq I_2$. If the determination at the step S1025 is false, the battery ECU 130 determines that the PDU side current sensor 143 is malfunctioning (Step S1027). Accordingly, at the step S1029, the battery ECU 130 determines that only the PDU side current sensor 143 is malfunctioning, and ends the flow.

If the determination at the step S1025 is true, the battery ECU 130 determines that at least one of the first current sensor 113, the second current sensor 123, and the PDU side current sensor 143 is malfunctioning (Step S1031). Then, at a step S1033, it is determined whether or not $\alpha \times \beta_1 \times I_1 \neq I_3$. If the determination at the step S1033 is true, the battery ECU 130 maintains the determination that at least one of the first current sensor 113, the second current sensor 123, and the PDU side current sensor 143 is malfunctioning (Step S1035). Accordingly, the battery ECU 130 determines that the malfunctioned current sensor is uncertain, and ends the flow. It should be noted that at a step S1037, the battery ECU 130 may output the fact that the malfunctioned current sensor is uncertain to the control apparatus of the transport device 10.

If the determination at the step S1033 is false, the battery ECU 130 determines that the second current sensor 123 is malfunctioning (Step S1041). Accordingly, at a step S1043, it is determined that the second current sensor 123 is malfunctioning, and the flow ends.

As described above, according to the transport device 10, since the current value when the first storage battery 111 performs the simultaneous discharge to the second storage battery 121 and the MG 144 is used, the states of the first current sensor 113, the second current sensor 123, and the PDU side current sensor 143 can be detected rapidly. For that reason, it becomes possible to perform a state detection of each current sensor with high frequency. Also, the accuracy for detecting the state of each current sensor can be increased. Also, since the states of the current sensors are determined based on the comparison of the current values detected by the current sensors, a special circuit or means for detecting the states of the current sensors is not necessary. Further, the states of the current sensors can be determined without requiring a special charge/discharge pattern. For that reason, during the operations of the transport device 10, the states of the current sensors can be determined.

It should be noted that the transport device is not limited to an electric vehicle. The transport device may be a vehicle, such as a hybrid car comprising a power supply apparatus and an internal combustion engine, a train and the like. The transport device is not limited to a vehicle and includes various devices for transporting objects moving by land, air or water, or under water, such as airplanes or ships comprising a power supply apparatus. The transport device is a concept including various devices for transport comprising a power supply apparatus.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . transport device, 100 . . . power storage device, 101 . . . first electric storage module, 102 . . . second electric storage module, 103 . . . charge/discharge circuit module, 111 . . . first storage battery, 112 . . . first voltage sensor, 113 . . . first current sensor, 114 . . . first switch, 121 . . . second storage battery, 122 . . . second voltage sensor, 123 . . . second current sensor, 124 . . . second switch, 130 . . . battery ECU, 131 . . . first VCU, 132 . . . second VCU, 133 . . . third switch, 140 . . . driving module, 142 . . . third voltage sensor, 141 . . . PDU, 143 . . . PDU side current sensor, 144 . . . MG, 151 . . . charging converter, 152 . . . power reception section, 153 . . . external power supply, 190 . . . recording medium

What is claimed is:

1. A power supply apparatus, comprising:
a first electric storage module which has a first electric storage section and a first sensor that detects a first current value being a value of charge/discharge current of the first electric storage section;
a second electric storage module which has a second electric storage section and a second sensor that detects a second current value being a value of charge/discharge current of the second electric storage section; and
a circuit module which has a charge/discharge circuit and a control section, the charge/discharge circuit performing charge/discharge between the first electric storage section, the second electric storage section, and a driving section, the driving section driven using power of at least one of the first electric storage section and the second electric storage section, the control section controlling the charge/discharge circuit, wherein
the control section acquires a third current value being a value of charge/discharge current of at least one of the first electric storage section and the second electric storage section to the driving section,
performs at least one of a first operation of comparing the first current value with the third current value in charge/discharge between the first electric storage section and the driving section, and a second operation of comparing the second current value with the third current value in charge/discharge between the second electric storage section and the driving section,
performs a third operation of respectively comparing the first current value with the second current value, and the first current value with the third current value in a simultaneous discharge of the first electric storage section to the second electric storage section and the driving section, and
determines a state of at least one of the first sensor, the second sensor, and a third sensor by at least one of the first operation and the second operation and by the third operation, the third sensor detecting the third current value.

2. The power supply apparatus according to claim 1, wherein
the control section controls the charge/discharge circuit in the third operation such that the first electric storage section outputs a constant power to the driving section without depending on a required power and the second electric storage section is charged by a difference between the constant power and the required power.

3. The power supply apparatus according to claim 2, wherein
the first sensor detects the constant power in the third operation, and
in the third operation, the control section respectively compares a value corresponding to the required power in the first current value with the third current value, and a value corresponding to a difference between the constant power and the required power in the first current value with the second current value.

4. The power supply apparatus according to claim 2, wherein
the control section acquires a charge rate of the second electric storage section and sets the constant power based on the charge rate of the second electric storage section.

5. The power supply apparatus according to claim 2, wherein
the control section sets the constant power to become larger as a charge rate of the second electric storage section is smaller.

6. The power supply apparatus according to claim 1, wherein
the control section determines whether or not current values to be compared are equivalent or have correlation in the first operation, the second operation, and the third operation.

7. The power supply apparatus according to claim 6, wherein
the correlation is based on a step-up/down rate of the charge/discharge circuit between the first, second, and third sensors detecting the current values to be compared.

8. The power supply apparatus according to claim 1, wherein
the second electric storage section has a poor energy density and an excellent output density compared with the first electric storage section.

9. The power supply apparatus according to claim 1, wherein
the first electric storage section has a larger battery capacity compared with the second electric storage section.

10. The power supply apparatus according to claim 1, wherein
characteristic of the second electric storage section is different from characteristic of the first electric storage section.

11. The power supply apparatus according to claim 3, wherein
the control section acquires a charge rate of the second electric storage section and sets the constant power based on the charge rate of the second electric storage section.

12. The power supply apparatus according to claim 3, wherein
the control section sets the constant power to become larger as a charge rate of the second electric storage section is smaller.

13. The power supply apparatus according to claim 6, wherein
the control section controls the charge/discharge circuit in the third operation such that the first electric storage section outputs a constant power to the driving section without depending on a required power and the second electric storage section is charged by a difference between the constant power and the required power.

14. The power supply apparatus according to claim 13, wherein
the first sensor in the third operation detects the constant power, and
the control section in the third operation respectively compares a value corresponding to the required power in the first current value with the third current value, and a value corresponding to a difference between the constant power and the required power in the first current value with the second current value.

15. The power supply apparatus according to claim 13, wherein
the control section acquires a charge rate of the second electric storage section and sets the constant power based on the charge rate of the second electric storage section.

16. The power supply apparatus according to claim 13, wherein
the control section sets the constant power to become larger as a charge rate of the second electric storage section is smaller.

17. The power supply apparatus according to claim 14, wherein
the control section acquires a charge rate of the second electric storage section and sets the constant power based on the charge rate of the second electric storage section.

18. A transport device comprising the power supply apparatus according to claim 1.

19. A determination method in a power supply apparatus, the power supply apparatus comprising:
a first electric storage module which has a first electric storage section and a first sensor that detects a first current value being a value of charge/discharge current of the first electric storage section;
a second electric storage module which has a second electric storage section and a second sensor that detects a second current value being a value of charge/discharge current of the second electric storage section; and
a charge/discharge circuit which performs charge/discharge between the first electric storage section, the second electric storage section, and a driving section, the driving section driven using power of at least one of the first electric storage section and the second electric storage section, wherein
the determination method comprises:
performing at least one of a first operation of comparing the first current value with a third current value in charge/discharge between the first electric storage section and the driving section, and a second operation of comparing the second current value with the third current value in charge/discharge between the second electric storage section and the driving section,
performing a third operation of respectively comparing the first current value with the second current value, and the first current value with the third current value in a simultaneous discharge of the first electric storage section to the second electric storage section and the driving section, and
determining a state of at least one of the first sensor, the second sensor, and a third sensor by at least one of the first operation and the second operation and by the third operation, the third sensor detecting the third current value being a value of charge/discharge current of at least one of the first electric storage section and the second electric storage section to the driving section.

20. A non-transitory computer readable medium storing a program for determining in a power supply apparatus, the power supply apparatus comprising:
a first electric storage module which has a first electric storage section and a first sensor that detects a first current value being a value of charge/discharge current of the first electric storage section;
a second electric storage module which has a second electric storage section and a second sensor that detects a second current value being a value of charge/discharge current of the second electric storage section; and
a charge/discharge circuit which performs charge/discharge between the first electric storage section, the second electric storage section, and a driving section, the driving section driven using power of at least one of the first electric storage section and the second electric storage section, wherein
the program causes a computer to execute:
performing at least one of a first operation of comparing the first current value with a third current value in charge/discharge between the first electric storage section and a driving section, and a second operation of comparing the second current value with the third current value in charge/discharge between the second electric storage section and the driving section,
performing a third operation of respectively comparing the first current value with the second current value, and the first current value with the third current value in a simultaneous discharge of the first electric storage section to the second electric storage section and the driving section, and determining a state of at least one of the first sensor, the second sensor, and a third sensor by at least one of the first operation and the second operation and by the third operation, the third sensor detecting the third current value being a value of charge/discharge current of at least one of the first electric storage section and the second electric storage section to the driving section.

\* \* \* \* \*